United States Patent [19]

Sato

[11] Patent Number: 5,670,782

[45] Date of Patent: Sep. 23, 1997

[54] SCANNING ELECTRON MICROSCOPE AND SPECIMAN OBSERVATION METHOD THEREBY

[75] Inventor: Mitsugu Sato, Hitachinaka, Japan

[73] Assignee: Hitachi, Ltd., Tokyo, Japan

[21] Appl. No.: 579,756

[22] Filed: Dec. 28, 1995

[30] Foreign Application Priority Data

Dec. 28, 1994 [JP] Japan ................................. 6-327068

[51] Int. Cl.⁶ .......................................... H01J 37/28
[52] U.S. Cl. .......................................... 250/310; 250/307
[58] Field of Search ................................. 250/310, 307

[56] References Cited

U.S. PATENT DOCUMENTS

| 4,713,548 | 12/1987 | Feuerbaum et al. | 250/310 |
| 4,803,358 | 2/1989 | Kato et al. | 250/310 |
| 5,387,793 | 2/1995 | Sato et al. | 250/310 |
| 5,424,541 | 6/1995 | Todokoro et al. | 250/310 |

*Primary Examiner*—Jack I. Berman
*Attorney, Agent, or Firm*—Kenyon & Kenyon

[57] ABSTRACT

An axially symmetric electrode to allow passage of the primary electron beam is installed on the electron beam path inside the magnetic pole of the objective lens so that the primary electron beam passing through the objective lens has a higher energy than the final acceleration voltage. The specimen stage has a sensor to detect the angle of specimen inclination, and the voltage applied to the electrode is decreased or is reduced to zero by a control means if the angle of specimen inclination is too wide.

23 Claims, 2 Drawing Sheets

SCANNING ELECTRON MICROSCOPE AND SPECIMAN OBSERVATION METHOD THEREBY

BACKGROUND OF THE INVENTION

The present invention relates to an electron beam device and a specimen observation method, and particularly to a scanning electron microscope suited to obtain a high-resolution image at a low acceleration voltage, as well as a specimen observation method using the scanning electron microscope.

A scanning electron microscope comprises an electron source, a condenser lens to condense electron beams emitted therefrom as fine probes onto a specimen, a beam deflection system to scan the condensed electron beams on the specimen in two dimensions, and a secondary electron detector to detect secondary electrons emitted from the specimen by exposure to the electron beam. It provides high-resolution observation of fine structures on the specimen surface with high magnification.

There has been a growing requirement in recent years for a scanning electron microscope which can be operated at low acceleration voltage ranging from 500 to 1000 volts in order to satisfy anti-static needs. To ensure high-resolution images at a low acceleration voltage, it is necessary to reduce the beam diameter by decreasing aberration of the objective lens. Aberration of the objective lens can be reduced by protruding the bottom face of the inner pole-piece by the same distance as that of the outer pole-piece or to a lower position, thereby causing the magnetic field of the lens to be produced on the specimen side, resulting in reduced focal distance of the objective lens.

Another way of reducing the aberration of the objective lens is disclosed in U.S. Pat. No. 4,713,543. As disclosed, an axially symmetric electrode is installed in the electron beam path from the electron gun to the objective lens, and a high voltage is applied to said electrode, thereby making the energy of the primary electron beam passing through the objective lens higher than the energy when it reaches the specimen (final acceleration voltage). In this case, the voltage applied to the electrode installed in the electron beam path is normally changed in proportion to a specified voltage or an acceleration voltage of the primary electron beam.

To obtain high resolution images by reducing the aberration of the objective lens, it is also possible to consider the combined use of these two methods wherein the magnetic field of the objective lens is produced on the specimen side, and the electrode is installed in the electron beam path to provide high energy acceleration to the electron beam passing through the magnetic field of the objective lens.

Authors tentatively manufactured a scanning electron microscope designed to have such a structure. It has been revealed as a result that high resolution observation is possible when a specimen having a flat surface is observed with the specimen stage placed horizontally; whereas aberration occurs on the specimen image without obtaining expected high resolution images when the specimen is inclined or when the specimen having big projections or edges on a surface is observed.

SUMMARY OF THE INVENTION

The object of the present invention is to provide a scanning electron microscope and specimen observation method using the same, which ensure a high resolution observation at a low acceleration voltage under the optimum equipment conditions in conformity with the specimen surface conditions or observation conditions, including observation of a specimen having projections and depressions or a specimen placed on an inclined plane.

The present invention uses an objective lens which causes the magnetic field of the lens to be produced on the specimen side. An electrode is installed in the electron beam path inside the magnetic pole of the objective lens to provide high-energy acceleration to the electron beam passing through the magnetic field of the objective lens. Application of voltage to the electrode may be controlled together with the acceleration voltage of the primary electron beam, or a constant voltage may be applied, independent of the acceleration voltage of the primary electron beam.

In this case, a strong retarding electric field occurs between the objective lens and the specimen. When a specimen having a flat face without being inclined is observed, this equipment condition is the optimum to minimize the aberration of the objective lens and allows a high resolution observation at a low acceleration voltage.

However, when a specimen having a flat face is to be observed on an inclined specimen stage or when a conductive specimen having big projections and depressions on the surface is to be observed, a retarding electric field is formed between the objective lens and the specimen is disturbed by the specimen stage inclination or projections and depressions on the specimen surface. The disturbance of this retarding electric field increases the astigmatism of the objective lens beyond that expected, making it impossible to get high resolution observation.

The present invention resulted from analyzing the causes for such defects. It achieves its objective by an optimum control of electric field intensity between the specimen and the objective lens as a function of the specimen stage inclination and the conditions of the specimen surface, and by minimizing the objective lens aberration under any observation conditions. Namely, the present invention is characterized by a scanning electron microscope comprising: (1) a condenser lens system to irradiate the primary electron beam to the specimen by reducing the diameter of the primary electron beam, (2) an electron beam deflection means for two-dimensional scanning of the primary electron beam on the specimen, (3) an objective lens, and (4) a specimen stage having a mechanism for inclining the specimen 1. Furthermore, in accordance with the invention, the specimen stage is provided with an inclination detecting mean; an axially symmetric electrode through which the primary electron beam can pass, installed on the electron beam path inside the magnetic pole of the objective lens; and a control means which controls the voltage applied to the axially symmetric electrode depending upon the inclination of the specimen stage according to the output from said inclination detecting means.

When the angle of the specimen stage inclination exceeds a specified value, the control means may provide a stepped control where the voltage applied to the electrode is switched to zero or a specified value which is smaller than that applied when the angle of specimen stage inclination is zero. Alternatively, the control means may provide a continuously changing control of the applied voltage according to the angle of the specimen stage inclination.

It is also possible to install (1) a means providing an interlocked control wherein a plurality of axially symmetric electrodes installed on the electron beam path inside the magnetic pole of the objective lens are separated from one another in the axial direction, and the voltage applied to the electrodes located closer to the specimen is controlled as a function of the angle of the specimen stage inclination according to the output from the inclination detecting means; and (2) a means of applying a specified positive voltage to the electrodes located farther from the specimen. The specified positive voltage is preferred to be of the order of tens of volts to hundreds of volts.

It is also possible to provide interlocked control of both the voltage applied to the electrodes located closer to the specimen and the voltage applied to the electrodes located farther from the specimen, with the voltage to the electrodes located farther from the specimen being set to a specified constant voltage.

Furthermore, it is also possible to provide a means of controlling the excitation current of the objective lens depending upon the voltage applied to the electrode, or a means of controlling the scan width of the primary electron beam. The objective lens may be designed in such a way that the inner pole piece is more protruded on the specimen side than the outer pole piece, and the secondary electron detector may be installed over the objective lens.

The specimen observation method according to the present invention is a specimen image observation method using a scanning electron microscope characterized by: (a) installing an axially symmetric electrode to allow passage of the primary electron beam in the electron beam path inside the magnetic pole of the objective lens; (b) mounting the specimen on the specimen stage and scanning it with the primary electron beam which has passed through the electrode with positive voltage applied to the electrode; and (c) detecting the secondary electrons emitted from the specimen using a secondary electron detector installed over said objective lens, thereby forming specimen images, and controlling the voltage applied to the electrode as a function of the angle of the specimen stage inclination.

When the angle of the specimen stage inclination exceeds a specified value, the voltage applied to the electrode can be controlled by switching it to zero or to a specified value which is smaller than that applied when the angle of specimen stage inclination is zero. Alternatively, the control means may provide a continuously changing control of the applied voltage according to the angle of the specimen stage inclination. It is also possible to install an inclination angle sensor on the specimen stage, and to provide automatic control by a controller based on the sensor output. This control may also be done manually.

Furthermore, the specimen observation method according to the present invention is characterized in that the voltage applied to the electrode is selected in conformity with projections and depressions of the specimen surface.

Use of an objective lens having a short focal distance and small aberration allows the electron beam spot diameter to be reduced, thereby ensuring high resolution images. The aberration of the objective lens can be further reduced by accelerating the electron beam passing through the magnetic pole of the objective lens by means of the electrode installed inside the magnetic pole of the objective lens. The electric field resulting from the electrode installed inside the magnetic pole of the objective lens also serves to lead the secondary electron emitted from the specimen to the secondary electron detector. Thus, under the normal observation conditions without inclining the specimen stage, the present invention allows high resolution images to be observed under the optimum conditions with the minimum aberration of the objective lens.

When the voltage applied to the electrode installed in the electron beam path inside the magnetic pole of the objective lens is controlled in proportion to the acceleration voltage of the primary electron beam, it is possible to expect improved resolutions which are equal for different acceleration voltages. On the other hand, when the electrode voltage is controlled constantly independent of the acceleration voltage of the primary electron beam, better resolution improvement efficiency can be obtained from a lower acceleration voltage with reduced resolution.

When the specimen stage is included, on the other hand, inclination of the specimen stage will disturb the retarding electric field produced between the specimen and the electrode installed on the electron beam path inside the magnetic pole of the objective lens; this results in unexpected increased aberration. In this case, the aberration of the object lens is rather reduced by stopping the electrode function by decreasing the voltage applied to the electrode or reducing it to zero, and this provides high resolution images under the optimum conditions.

When a plurality of electrodes is installed on the path inside the magnetic pole of the objective lens, the voltage applied to the electrodes located closer to the specimen is changed in conformity with the angle of the specimen stage inclination, thereby controlling the increase in the aberration of the objective lens. In this case, it is possible to improve the secondary electron detecting efficiency without increasing the lens aberration, by applying a positive voltage of tens of volts to hundreds of volts to the electrodes located farther from the specimen, independent of the angle of the specimen stage inclination. The secondary electron detecting efficiency can be more improved if control is made as a function of the voltage applied to the electrodes located closer to the specimen, without keeping the constant voltage applied to the electrodes located farther from the specimen.

The focal effect of the primary electron beam and the scan width of the primary electron beam on the specimen are changed by changing the voltage applied to the electrode installed in the electron beam path inside the magnetic pole of the objective lens. So if the excitation current of the objective lens and the scan line of the primary electron beam are controlled together with the primary electron beam, the focus can be kept always at the same specimen position without the magnification being changed, even if the voltage applied to the electrode is changed.

Furthermore, when the specimen has projections and depressions on the surface, for example, in observation of the specimen edge, and when the specimen is electrically conductive in particular, the electric field is disturbed by the projections and depressions, resulting in increased lens aberration. Thus, observation of the specimen can be made under the optimum conditions of the minimum lens aberration when the voltage applied to the electrode installed on the electron beam path inside the magnetic pole of the objective lens is set to zero or to a value which is smaller than that applied to a specimen having flat surfaces.

In this case as well, if a low voltage of tens of volts to hundreds of volts is applied to a plurality of electrodes located farther from the specimen, the secondary electron capturing efficiency can be improved, without the possibility of a disturbed electric field being produced close to the specimen which would result in increased aberration.

According to the present invention, the object lens aberration can be minimized by increasing the voltage applied to the electrode (or electrodes located closer to the specimen when a plurality of electrodes are provided) installed on the electron beam path inside the magnetic pole of the objective lens, when the specimen has no big projections and depressions and the angle of the specimen stage inclination is narrow. When the specimen has big projections and depressions and the angle of the specimen stage inclination is increased for observation, the electrode voltage is decreased, resulting in reduced electric field between the objective lens and the specimen, hence preventing an increase of the astigmatism due to disturbance of the electric field. This makes it possible to always observe the specimen under the high resolution conditions best suited to the specimen surface and observation conditions.

DETAILED DESCRIPTION

Figure 1:
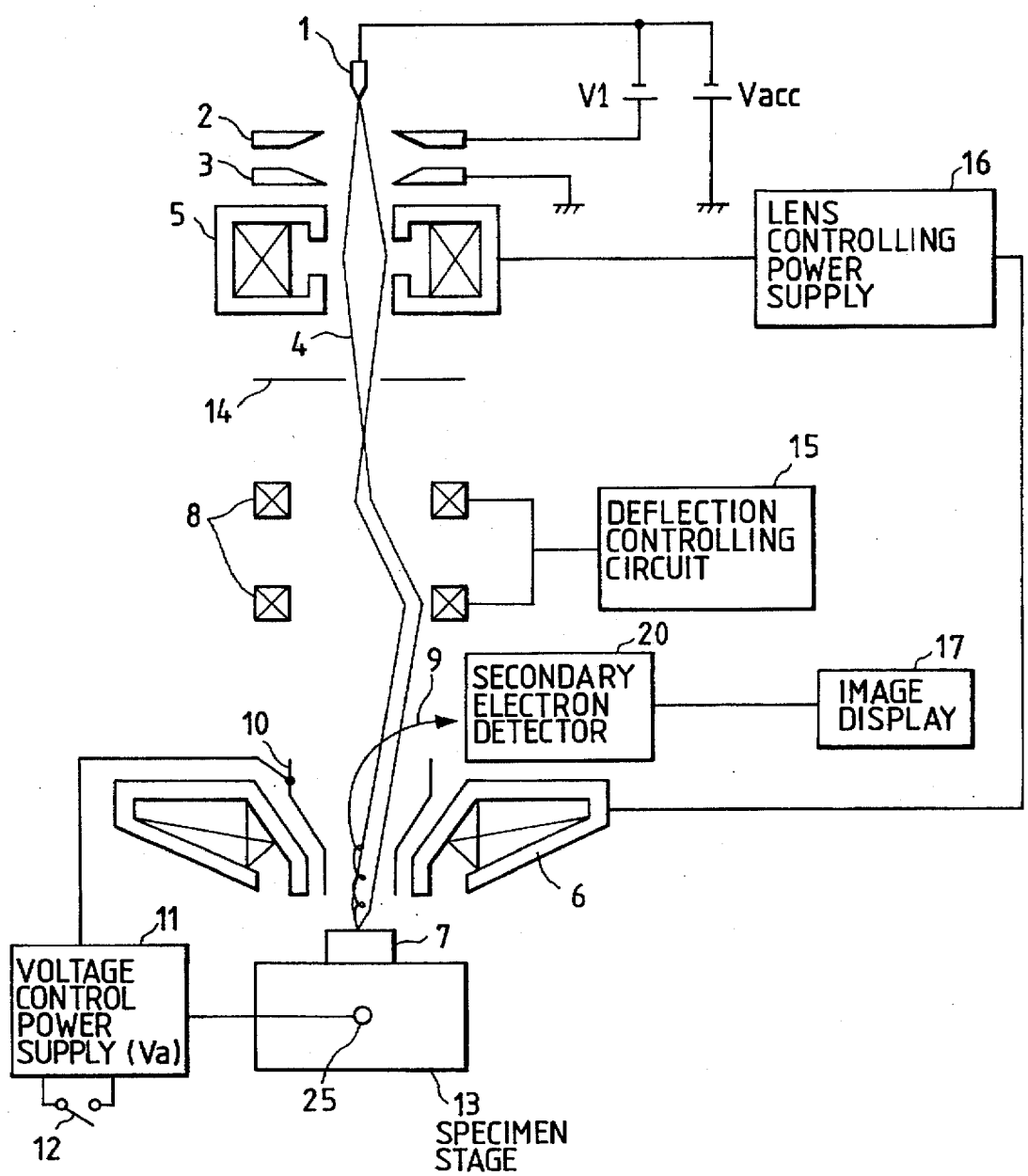
FIG. 1 is a drawing illustrating one embodiment of the present invention.

The following gives a detailed description of the present invention with reference to embodiments illustrated in the drawings.

FIG. 1 is a cross-sectional view illustrating one embodiment of the present invention. A primary electron beam 4 emitted from a cathode 1 due to the voltage V1 (4 kV, for example) applied to the cathode 1 and a first anode 2 is accelerated by a voltage Vacc (1 kV, for example) applied to a second anode 3 to reach the lens system located in the later stage. The primary electron beam 4 is condensed to a fine spot onto specimen 7 by a condenser lens 5 and an objective lens 6 controlled by a lens controlling power supply 16, and the condensing angle (beam opening angle) of the primary electron irradiated onto the specimen 7 by an objective lens aperture stop 14. The primary electron beam 4 is scanned on the specimen in two dimensions by a deflection coil 8. The scan signal of the deflection coil 8 is controlled by a deflection controlling circuit 15 as a function of the observation magnification.

An axially symmetric cylindrical electrode 10 is installed in the electron beam path of the objective lens 6, and a positive voltage Va (500 volts, for example) is applied to it by a voltage control power supply 11. After being more accelerated by the voltage Va applied to the electrode 10 than by acceleration voltage Vacc, the primary electron beam 4 is decelerated to its original energy (Vacc) as it moves between the objective lens 6 and the specimen 7, and is irradiated on the specimen 7. The design is such that the magnetic field of the objective lens 6 occurs on the specimen side. When positive voltage Va is applied to the electrode 10, the primary electron beam 4 passes through the magnetic field of the objective lens with an energy higher than Vacc, resulting in reduced lens aberration. The secondary electron 9 emitted from the specimen 7 by irradiation of the primary electron beam 4 is trapped by the magnetic field of the objective lens 6, and is fed through the objective lens to be detected by the secondary electron detector 20. The signal sent from the secondary electron detector 20 is input to the image display 17 which shows an enlarged image of the specimen. In the present embodiment, voltage Va is set at a specified value which is independent of the acceleration voltage Vacc, so greater resolution improvement efficiency is provided by a lower acceleration voltage with a remarkable increase in resolution.

The acceleration voltage Vacc and electrode voltage Va must be changed simultaneously to ensure that the excitation current of the objective lens 6 will be greater as the acceleration voltage Vacc and electrode voltage Va are higher.

The relationship between the acceleration voltage Vacc and the electrode voltage Va required to focus the electron beam on the same point and the excitation current of the objective lens is obtained in experimental formulae or tabulated form in advance by experiment and simulation, and the experiment formulae or tables are used for implementation.

The specimen stage 13 allows the specimen to be moved in the horizontal direction (X, Y) as well as in the vertical direction (Z), and allows the specimen to be inclined. A sensor 25 is provided to detects the inclination angle. Furthermore, the specimen stage 13 is electrically conductive and is maintained at ground potential or a negative constant voltage. The specimen inclination angle detecting sensor 25 issues signals when the angle of the specimen stage inclination is more than a preset value (e.g., 30 degrees), and this signal actuates the voltage control power supply 11, so that the voltage Va applied to electrode 10 is changed to a smaller value or zero. This control operation reduces the magnetic field between the objective lens 6 and the specimen 7, thereby preventing the astigmatism from being increased by disturbance of the electric field resulting from inclination of the specimen stage.

The manner of changing the electrode voltage Va according to the angle of the specimen stage inclination is determined in conformity with the value of voltage Va applied to the electrode 10 and the value of acceleration voltage Vacc, so that astigmatism will be the minimum under all observation conditions. The applied voltage Va may be changed in steps according to the angle of the specimen stage inclination, or may be changed continuously.

The voltage control power supply 11 is provided with a manual switch 12. When the specimen is electrically conductive and contains big projections and depressions on the surface, resulting in disturbance of the electric field formed between the electrode 10 and the specimen 7, the magnetic field is reduced by setting the voltage applied to electrode 10 to a smaller value or zero independent of the signal of the specimen inclination angle detecting sensor 25.

According to the present embodiment, the magnetic field between the specimen and the objective lens is controlled to the optimum in conformity with the specimen stage inclination angle and specimen surface conditions, and the objective lens aberration is minimized under all observation conditions, thereby ensuring high resolution observation of the specimen.

Figure 2:
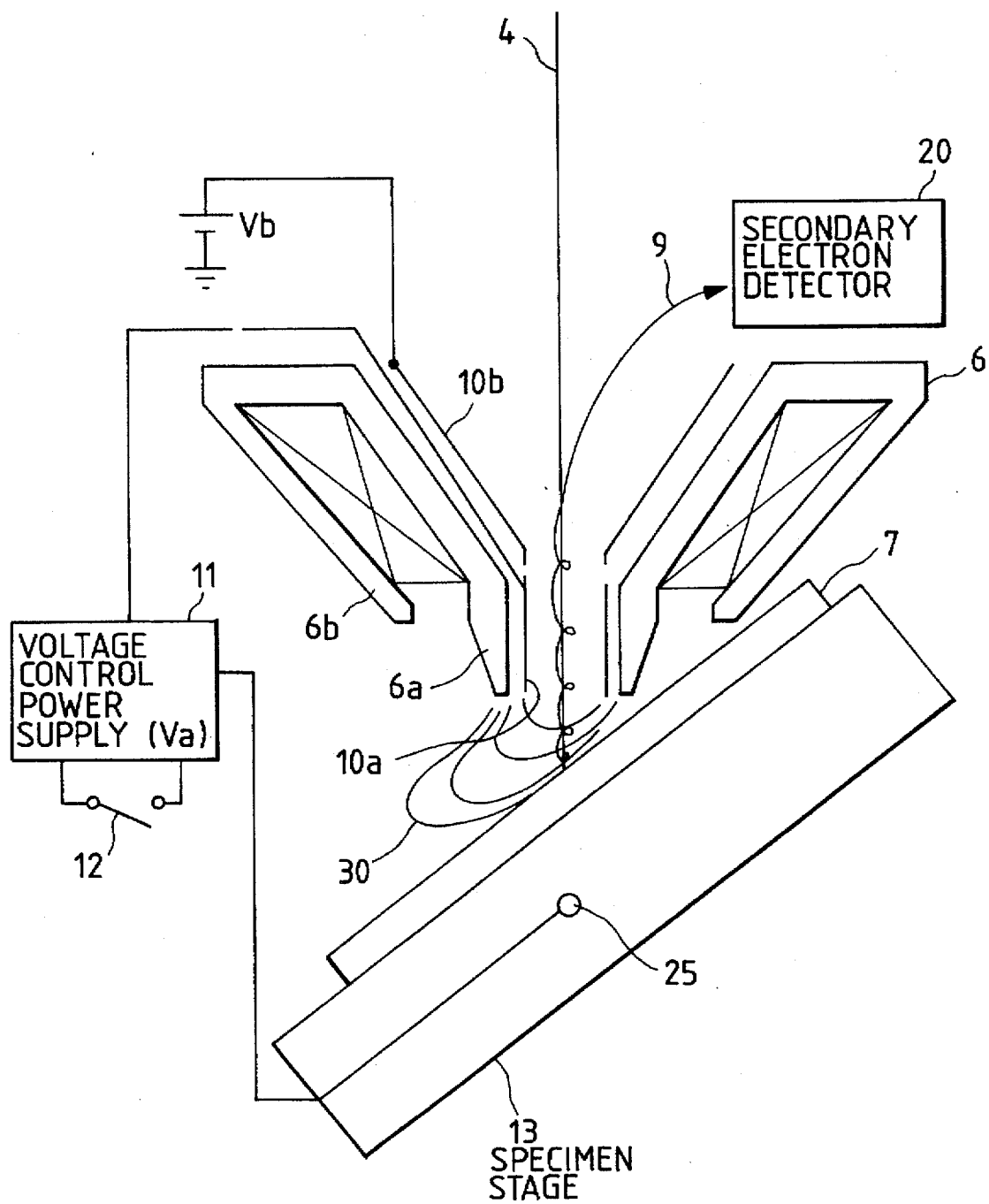
FIG. 2 is a drawing illustrating another embodiment of the present invention.

FIG. 2 is a cross-sectional view close to the objective lens according to another embodiment of the present invention. The objective lens 6 according to the present embodiment has an inner pole piece 6a which is more projected toward the specimen than the outer pole piece 6b to ensure that a large sized specimen 7 can be inclined to a narrow angle. This will increase the distance between the bottom face of the objective lens and the secondary electron detector 20; therefore, in order to ensure effective detection of the secondary electron 9 emitted from the specimen 7, it is necessary to accelerate the secondary electron 9 in such a manner as to shift it to the side of the secondary electron detector 20. To achieve this purpose, two independent axially symmetric electrodes 10a and 10b are installed in the electron beam path inside the magnetic pole of the objective lens, and a specified positive voltage Vb is applied to the upper electrode 10b, thereby accelerating the secondary electron 9 to the side of the secondary electron detector. A positive voltage Va is applied to the electrode 10a located closer to the specimen 7, and the primary electron beam 4 is accelerated to have higher energy than Vacc, thereby feeding it through the magnetic field of the objective lens. When the specimen stage 13 is not inclined or it is inclined at a very narrow angle, this operation causes the aberration of the objective lens to be optimized, ensuring high resolution observation of the specimen.

If the specimen stage 13 is inclined with a voltage Va kept applied to the electrode 10a on the lower side, the electric field formed between the electrode 10a and the specimen 7 will be disturbed as indicated by the equipotential line 30 in FIG. 2, and axial symmetry is lost, resulting in aberration. Thus, when the specimen stage 13 is inclined, the voltage of electrode 10a is controlled to zero or to a lower value using the voltage control power supply 11 in response to the specimen inclination angle detecting sensor 25, thereby preventing astigmatism from being produced by the axially asymmetrical electric field between the objective lens and the specimen.

Furthermore, in the case of a specimen having projections and depressions, the voltage of the electrode 10a is set to zero or a lower value by the manual switch 12, independently of the specimen inclination angle detecting sensor 25 and its signal, thereby preventing an axially asymmetrical electric field from being produced between the objective lens and specimen.

Voltage applied to electrodes 10a and 10b can be read by a control CPU (not illustrated). Simultaneously with the applied voltage, the lens controlling power supply 16 and the deflection controlling circuit 15 are controlled, and excitation current of the objective lens 6 and scan signal of the deflection coil 8 are also controlled. The excitation current of the objective lens 6 and the scan signal of the deflection coil 8 are also controlled according to the control formulae obtained by experiment or simulation in advance or data read from a table, so that focus and magnification conditions will apparently disappear with respect to changes in voltage applied to the electrode.

According to the present embodiment, even if the voltage applied to the electrode 10a on the lower side is reduced to zero or a smaller value, the secondary electron 9 produced from specimen 7 is accelerated by voltage Vb applied to electrode 10b and goes to the secondary electron detector 20, because a specified voltage Vb is applied to the electrode 10b on the upper side. This makes it possible to minimize the aberration of the objective lens 6 at all times, while ensuring a high efficiency in secondary electron detection by the secondary electron detector 20.

The voltage Vb applied to the electrode 10b on the upper side is assumed to be constant in the above case. It is also possible to control the Vb simultaneously with the voltage Va kept applied to the electrode 10a on the lower side. In this case, it is effective to obtain the relation with Vb in advance by experiment or simulation to ensure that the efficiency in secondary electron detection will not deteriorate with respect to each electrode voltage Va, and to interlock the Vb with the Va on the basis of said relation.

According to the present embodiment, the magnetic field between the specimen and the objective lens is controlled to an optimum in conformity with the specimen stage inclination angle and specimen surface conditions, and the objective lens aberration is minimized under all observation conditions, thereby ensuring high resolution observation of the specimen.

What is claimed is:

1. A scanning electron microscope comprising:
   a. a specimen stage adapted to receive a specimen and including an inclining mechanism;
   b. a cathode emitting a primary electron beam;
   c. a condenser lens system reducing the diameter of said primary electron beam and directing said primary electron beam to a specimen on said stage;
   d. an electron beam deflecter providing two-dimensional scanning of said primary electron beam on said specimen;
   e. an objective lens having a magnetic pole;
   f. an inclination detector, detecting the inclination of said stage and providing an output signal indicative thereof;
   g. an axially symmetric electrode through which said primary electron beam passes, installed in the electron beam path inside said magnetic pole of said objective lens; and
   h. a first control which controls the voltage applied to said electrode as a function of the inclination of said specimen stage based on the output signal from said inclination detector.

2. A scanning electron microscope according to claim 1 and further comprising a second control controlling the scan width of said primary electron beam in dependence on the voltage applied to said electrode.

3. A scanning electron microscope according to claim 1 and further comprising a third control controlling the excitation current of said objective lens in dependence on the voltage applied to said electrode.

4. A scanning electron microscope according to claim 1 wherein said first control is adapted to switch the voltage applied to said electrode to one of zero and a specified value which is smaller than that applied when the angle of specimen stage inclination is zero, when the inclination angle of said specimen stage exceeds a specified value.

5. A scanning electron microscope according to claim 4 and further comprising a second control controlling the scan width of said primary electron beam in dependence on the voltage applied to said electrode.

6. A scanning electron microscope according to claim 4 and further comprising a third control controlling the excitation current of said objective lens in dependence on the control of the voltage applied to said electrode.

7. A scanning electron microscope according to claim 1 wherein said first control is adapted to continuously change the voltage applied to said electrode as a function of the inclination angle of said specimen stage.

8. A scanning electron microscope according to claim 7 and further comprising a second control controlling the scan width of said primary electron beam in dependence on the voltage applied to said electrode.

9. A scanning electron microscope according to claim 7 and further comprising a third control controlling the excitation current of said objective lens in dependence on the control of the voltage applied to said electrode.

10. A scanning electron microscope according to claim 1 wherein a secondary electron detector is installed over said objective lens.

11. A scanning electron microscope according to claim 7 further comprising a third control controlling the scan width of said primary electron beam as a function of the voltage applied to said plurality of said electrodes.

12. A scanning electron microscope comprising:
    a. a specimen stage adapted to receive a specimen and including an inclining mechanism;
    b. a cathode emitting a primary electron beam;
    c. a condenser lens system reducing the diameter of said primary electron beam and directing said primary electron beam to a specimen on said stage;

d. an electron beam deflecter providing two-dimensional scanning of said primary electron beam on said specimen;

e. an objective lens having a magnetic pole;

f. an inclination detector, detecting the inclination of said stage and providing an output signal indicative thereof;

g. a plurality of axially symmetric electrodes installed in the electron beam path inside the magnetic pole of said objective lens, separated from one another in the axial direction, through which said primary electron beam passes; and h. a first control which controls the voltage applied to one of said plurality of electrodes located closer to the specimen as a function of the inclination of said specimen stage based on the output signal from said inclination detector; and i. a circuit applying a specified positive voltage to the ones of said plurality of electrodes located farther from the specimen.

13. A scanning electron microscope according to claim 12 wherein said secondary electron detector is installed over said objective lens.

14. A scanning electron microscope according to claim 12 and further comprising a second control controlling the excitation current of said objective lens as a function of the voltage applied to said plurality of said electrodes.

15. A scanning electron microscope comprising:

a. a specimen stage adapted to receive a specimen and including an inclining mechanism;

b. a cathode emitting a primary electron beam;

c. a condenser lens system reducing the diameter of said primary electron beam and directing said primary electron beam to a specimen on said stage;

d. an electron beam deflecter providing two-dimensional scanning of said primary electron beam on said specimen;

e. an objective lens having a magnetic pole;

f. an inclination detector, detecting the inclination of said stage and providing an output signal indicative thereof;

g. a plurality of axially symmetric electrodes installed in the electron beam path inside the magnetic pole of said objective lens, separated from one another in the axial direction through which said primary electron beam passes; and h. a first control which controls the voltage applied to the one of said plurality electrodes located closer to the specimen as a function of the inclination of said specimen stage based on the output signal from said inclination detector; and i. a second control controlling the voltage applied to the ones of said plurality of electrodes located farther from the specimen, as a function of the voltage applied to the ones of said plurality electrodes closer to said specimen.

16. A scanning electron microscope according to claim 15 and further comprising a third control controlling the excitation current of said objective lens as a function of the voltage applied to said plurality of electrodes.

17. A scanning electron microscope according to claim 15 further comprising a fourth control controlling the scan width of said primary electron beam as a function of the voltage applied to said plurality of electrodes.

18. A scanning electron microscope according to claim 15 wherein said objective lens has an inner pole piece and an outer pole piece, said inner pole piece projects more toward the specimen than said outer pole piece.

19. A scanning electron microscope according to claim 15 wherein said secondary electron detector is installed over said objective lens.

20. A method of observing a specimen using a scanning electron microscope which includes a cathode generating a primary electron beam and an objective lens, with a magnetic pole, focusing the beam on a specimen, comprising:

a. installing an axially symmetric electrode to allow passage of the primary electron beam in the electron beam path inside the magnetic pole of the objective lens;

b. mounting the specimen on an inclinable specimen stage;

c. applying a positive voltage to said electrode;

d. scanning the primary electron beam which has passed through said electrode on said specimen;

e. detecting secondary electrons emitted from the specimen using a secondary electron detector installed over said objective lens, thereby forming specimen images; and f. controlling the voltage applied to said electrode as a function of the inclination angle of said specimen stage.

21. A specimen observation method according to claim 20 wherein said step of controlling comprises switching the voltage applied to said electrode to one of zero and a specified value which is smaller than that applied when the inclination angle of said specimen stage is zero, when the inclination angle of said specimen stage exceeds a specified value.

22. A specimen observation method according to claim 20 wherein said step of controlling comprises continuously changing the voltage applied to said electrode as a function of the inclination angle of said specimen stage.

23. A method of observing a specimen using a scanning electron microscope which includes a cathode generating a primary electron beam and an objective lens, with a magnetic pole, focusing the beam on a specimen, comprising:

a. installing an axially symmetric electrode to allow passage of the primary electron beam in the electron beam path inside the magnetic pole of the objective lens;

b. mounting the specimen on an inclinable specimen stage;

c. applying a positive voltage to said electrode;

d. scanning the primary electron beam which has passed through said electrode on said specimen;

e. detecting the secondary electron emitted from the specimen using a secondary electron detector installed over said objective lens, thereby forming specimen images; and f. controlling the voltage applied to said electrode based on projections and depressions on the surface of the specimen.

* * * * *